United States Patent [19]
Poletto et al.

[11] Patent Number: 5,912,617
[45] Date of Patent: Jun. 15, 1999

[54] CIRCUIT FOR DRIVING A SIGNALING DEVICE

[75] Inventors: Vanni Poletto, Casale Monferrato; Alberto Poma, Pavia; Marco Morelli, Livorno, all of Italy

[73] Assignees: SGS-Thomson Microelectronics S.r.l., Agrate Brianza; Magneti Marelli S.p.A., Milan, both of Italy

[21] Appl. No.: 08/929,810

[22] Filed: Sep. 15, 1997

[30] Foreign Application Priority Data

Sep. 17, 1996 [EP] European Pat. Off. .............. 96830471

[51] Int. Cl.$^6$ ..................................................... B60Q 1/00
[52] U.S. Cl. ................................... 340/450.2; 340/450.2; 340/450; 340/435; 324/601; 73/304 R
[58] Field of Search ..................................... 340/618, 660, 340/661, 664, 438, 450, 450.2; 324/601, 609, 705, 720; 73/304 R

[56] References Cited

U.S. PATENT DOCUMENTS

| 4,513,277 | 4/1985 | Moore et al. | 340/450.2 |
| 5,408,418 | 4/1995 | Lippmann et al. | 340/450.2 |
| 5,506,564 | 4/1996 | Hargest | 340/450.2 |

FOREIGN PATENT DOCUMENTS

| 567 839 A1 | 11/1993 | European Pat. Off. | G01F 23/00 |
| 683 383 A1 | 5/1994 | European Pat. Off. | G01F 23/00 |
| 58-092824 | 6/1983 | Japan | G01F 23/00 |
| 60-18311 | 1/1994 | Japan | G01F 23/00 |

Primary Examiner—Jeffery A. Hofsass
Assistant Examiner—Julie Lieu
Attorney, Agent, or Firm—Allen, Dyer, Doppelt, Milbrath & Gilchrist, P.A.

[57] ABSTRACT

A circuit for controlling the reserve lamp of a vehicle's fuel level indicator instrument. The circuit uses a switch controlled by an extremely asymmetric clock signal periodically to switch, for a very short time, the signal provided by the level sensor coupled to a comparator operable to compare this signal with a threshold value for the purpose of determining the state of the reserve lamp.

34 Claims, 5 Drawing Sheets

CIRCUIT FOR DRIVING A SIGNALING DEVICE

FIELD OF THE INVENTION

The present invention relates in general to circuits for controlling indicator devices, for example, illuminable indicator devices. More specifically, the present invention concerns a circuit for controlling a lamp for indicating reaching a reserve level of fuel in a vehicle.

BACKGROUND OF THE INVENTION

A fuel level, such as for a vehicle, is often displayed by means of a needle indicator instrument of a crossed coil type. The associated sensor for detecting the level in the tank is typically provided by a resistor, the resistance of which varies as a function of the level itself. Hereinafter, the term resistance will be used for simplicity to indicate both a resistor and its associated resistance. It is the value of this variable resistance which provides the information for controlling a reserve level lamp. In particular, this lamp is to be lit when the variable resistance of the level sensor is above, or below, a predetermined threshold value.

Figure 1:
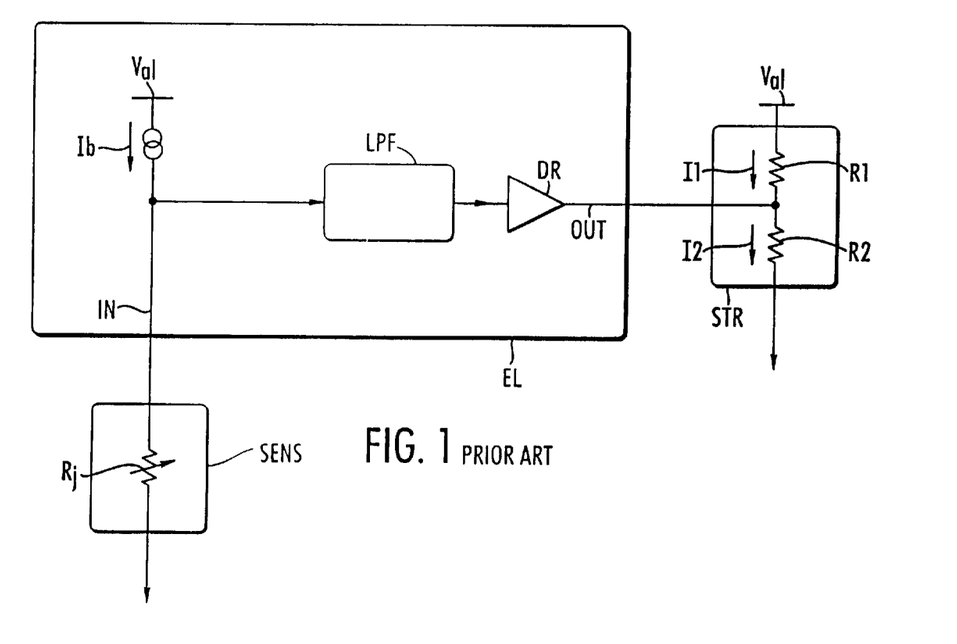
FIG. 1 is a schematic circuit representation of a prior art detector circuit capable of using a control circuit of the type in question, and which has already been described.

In known prior art systems, there is typically provided an electronic interface between the indicator instrument and the level sensor for the purpose of damping variations as may be caused by movements of the fuel during motion of the vehicle. In FIG. 1 there is illustrated a system of the type described above. As can be noted, this system basically comprises three modules or units: a level sensor SENS, an electronic processing circuit EL, and an indicator instrument STR. As previously stated, the sensor SENS is of variable resistance type provided by a resistance Rj which is variable as a function of the level of fuel in the tank.

The indicator instrument STR, as expected, is of the crossed coil type, illustrated in the drawing as two resistances R1 and R2. These coils R1 and R2 are connected in series and supplied by the vehicle's supply voltage Val. The currents which flow in the coils R1 and R2 are indicated respectively I1 and I2. The information displayed by the indicator instrument STR, that is, the position assumed by the needle of the instrument, depends on the ratio between the currents It and I2. This ratio depends, in turn, on the current arriving at or leaving the common node between the coils R1 and R2. Originally the sensor SENS was connected directly to this common node so that the ratio between the currents Id and I2 varied upon variation of the resistance Rj.

Currently, the prior art systems use instead an electronic processor circuit EL having an input IN connected to the sensor SENS, and an output OUT connected to the common node of the instrument STR. The processor circuit EL typically comprises a current generator acting to generate a biasing current Ib which is injected into the resistance Rj of the sensor SENS supplied by the supply voltage Val.

This biasing current Ib naturally induces a voltage across the resistance Rj of the sensor SENS. This voltage is sent to a low pass filter LPF the filtering effect of which is to substantially damp oscillations in the value of the resistance Rj due to oscillations of the fuel in the tank. The output of the filter LPF is then connected to an output circuit DR which, in turn, provides the output OUT of the processor circuit EL. The output OUT is operable to control the indicator instrument STR.

A circuit acting to control a reserve lamp, typically associated with the indicator instrument STR, typically also uses a signal generated by the sensor SENS, taken, for example, from within the processor circuit EL. The signal causes illumination of the reserve lamp when the fuel level in the tank falls below a predetermined threshold level.

The characteristics which a reserve lamp control circuit desirably has are as follows. The precision of the control circuit should be independent of the values of the resistance of the coils R1 and R2 of the indicator instrument STR. Otherwise, it would make calibration of the switching point of the lamp necessary in that the resistances R1 and R2 provide a significant source of inaccuracy. The circuit should damp variations in the signal emitted by the sensor SENS due to movements of the fuel. This damping should be similar to that used to provide the level indication in such a way that the variations in the state of the reserve lamp are correctly correlated with the movements of the needle of the indicator instrument STR.

In addition, the circuit should allow for programmability of the switching threshold of the reserve lamp, for example, by means of the selection of a value of a resistance. The circuit should also have a programable hysteresis, for example, by selection of the value of a resistance, to limit as much as possible the illuminations of the reserve lamp caused by successive switchings when the fuel level is close to the threshold level.

Figure 2:
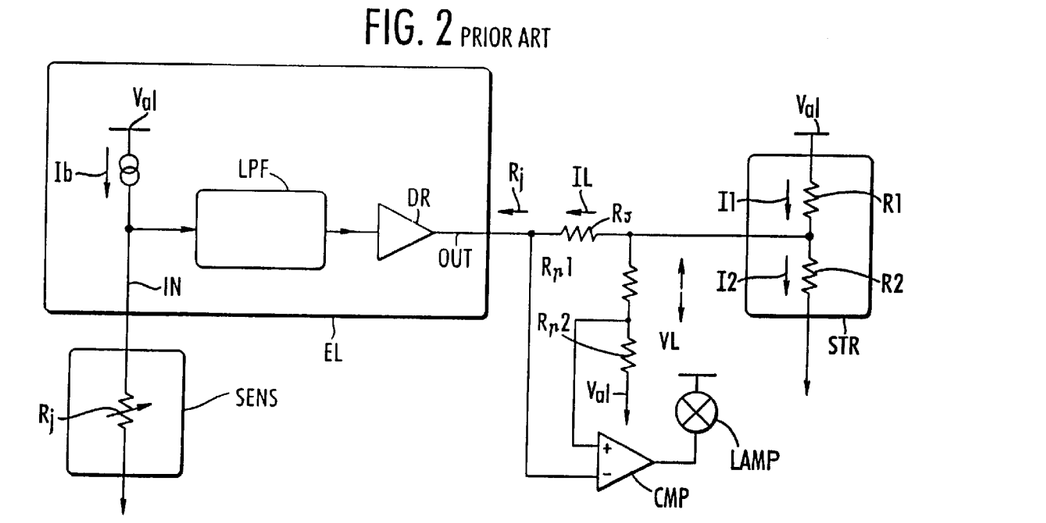
FIG. 2 is a schematic circuit representation of a prior art control circuit and which has already been described.

FIG. 2 illustrates an alternative prior art form of the system of FIG. 1. In FIG. 2 and in the subsequent drawings, parts and elements already described with reference to the preceding figures have been assigned the same reference numerals and/or letters. In the circuit of FIG. 2, the decision to change the state of the reserve lamp, indicated LAMP, is taken by a comparator CMP on the basis of the measurement of the output resistance, also indicated Rj, with which the output circuit DR controls the indicator instrument STR.

In the drawing for completeness, there have also been shown an output current IL and an output voltage VL of the processor circuit EL. In fact, a voltage divider Rp1, Rp2 on the one hand, and a resistor Rs having output resistance Rj on the other, form a Wheatstone bridge which, based upon the direction in which it is unbalanced, sends to the comparator CMP a differential input voltage which can be positive or negative, and, as a consequence of which, the reserve lamp LAMP is extinguished or illuminated. Since the output resistance of the processor circuit EL is equal to the resistance Rj of the sensor SENS averaged in time by the low pass filter LPF, the change in state of the lamp LAMP is effected on the basis of an average resistance Rj, as well as by the constant resistances Rs, Rp1 and Rp2, according to the following equation:

$$Rj = Rs\, Rp2/Rp1$$

In this way the characteristics for controlling the reserve lamp LAMP listed above are satisfied.

The control circuit for the reserve lamp LAMP has a precision which is independent of the indicator instrument STR in that only the processor circuit EL plays a part in generating the output resistance Rj of the output circuit DR. This normally would have to correspond to the average value of the resistance Rj of the sensor SENS from which the switching threshold depends. As far as the correlation is concerned, it is seen that there is a single filter LPF common both to the circuit for controlling the lamp LAMP and the processor circuit EL of the indicator instrument STR, and, therefore, their dynamic behavior is closely correlated.

As far as the switching threshold is concerned, this can be easily programmed by choosing the values of the resistances Rs, Rp1 and Rp2. As far as the hysteresis is concerned, however, the circuit illustrated in FIG. 2 does not provide for it. This can easily be achieved, however, for example by modifying the value of the resistor Rp1 or Rp2 or both of these, on the basis of the state of the lamp LAMP, using controlled switches which add or subtract resistances in series or in parallel. However the prior art arrangement, illustrated in FIG. 2, has some disadvantages. These disadvantages include primarily a lack of precision and in the errors introduced by the circuit for controlling the reserve lamp LAMP, and will be further discussed hereinafter.

SUMMARY OF THE INVENTION

In view of the foregoing background, it is therefore an object of the present invention to provide a control circuit for an indicator device that reduces errors and, hence, improves accuracy in controlling the indicator device.

According to the present invention this object is achieved by a control circuit for an indicator device comprising a control circuit for an indicator device operable responsive to a signal relating to a physical parameter detected by a sensor, the signal also being sent to an indicator instrument operable to display information relating to the physical parameter. The control circuit preferably comprises a comparator, and a switch operable to periodically switch the signal towards the indicator device for a first time interval to display the information relating to the physical parameter, and towards the comparator for a second time interval. In addition, the comparator is preferably operable to compare the signal with a predetermined threshold value to determine a state for the indicator device.

The first time interval is preferably relatively long with respect to the second time interval. For example, the second time interval may be less than or equal to about a thousandth of the first time interval. The control circuit may also include means for memorizing the signal during the second time interval.

The predetermined threshold value is preferably programmable. In addition, the control circuit preferably further comprises hysteresis means for comparing the signal with a first threshold value to determine activation of the indicator device and with a second threshold value to determine deactivation of the indicator device to thereby activate commutation of the indicator device with hysteresis. Moreover, the first and second threshold values are preferably programmable for programming the hysteresis.

The control circuit may also include a low pass filter having digital feedback for control of the indicator instrument to compare the signal with the predetermined threshold value. The circuit may also include means for determining commutation of the state of the indicator device only after a predetermined number of comparisons performed in a corresponding number of time periods based upon the first and second time intervals.

The physical parameter is preferably a level of a liquid in a tank. Accordingly, the indicator device is preferably an illuminable indicator operable to indicate reaching a predetermined level of the liquid in the tank. In this embodiment, the sensor preferably comprises means for generating a variable resistance as the signal. This circuit may also include a reference resistance, and means for injecting a biasing current into the variable resistance for the first time interval, and into the reference resistance for the second time interval.

BRIEF DESCRIPTION OF THE DRAWINGS

Further advantages and characteristics of the present invention will become evident from the following detailed description, given with the aid of the attached drawings, provided purely by way of non-limitative example, in which.

DETAILED DESCRIPTION OF THE PREFERRED EMBODIMENTS

Figure 3:
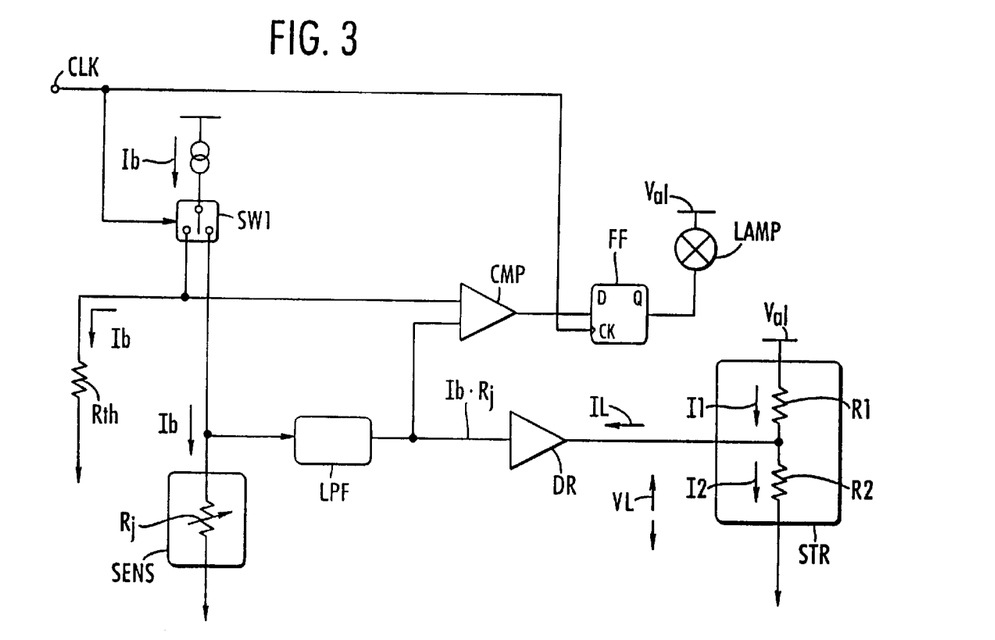
FIG. 3 is a schematic circuit representation of one embodiment of the control circuit according to the present invention.

FIG. 3 represents the basic embodiment of the present invention. As can be seen with respect to the system illustrated in FIG. 2, the following additional components are present: a reference resistance Rth which, on the basis of a comparison with the variable resistance Rj, makes it possible to establish the state of the lamp LAMP; a diverter switch SW1 which can divert the biasing current Ib from the variable resistance Rj to the reference resistance Rth and vice versa; a flip-flop FF which has the purpose of memorizing a logic signal output from the comparator CMP; a synchronization signal generator circuit (not illustrated) for generating clock signals CLK with a very asymmetric duty cycle, for example, 100 $\mu$s/500 ms, for controlling the diverter switch SW1 and the flip-flop FF.

Moreover, as can be seen, the comparator CMP in this case compares the output voltage of the low pass filter LPF with that of the reference resistor Rth. The operation of the lamp control circuit for controlling the lamp LAMP illustrated in FIG. 3 will now be described.

The clock signal CLK controls the diverter switch SW1 in such a way as to direct the biasing current Ib for the majority of the time, given the extremely asymmetric duty cycle, towards the variable resistance Rj. This allows the operation of the indicator instrument STR without any alteration with respect to the prior art system illustrated in FIG. 1. At relatively long time intervals, for example 500 ms, the clock signal CLK forces the diverter switch SW1 to divert the biasing current Ib from the variable resistance Rj to the reference resistance Rth. The dwell time of the biasing current Ib on the reference resistance Rth, with the consequent absence of biasing of the variable resistance Rj is, conversely, very short, for example, 100 $\mu$s. In this way the control of the lamp LAMP interferes in an extremely limited manner. For example, the lamp may be considered as interfering for only 100 $\mu$s out of every 500 ms, equal to 0.02 k=200 ppm, on the indicator instrument STR.

The voltage on the sensor SENS has a value given by the product Ib·Rj, where the biasing current Ib is to be considered as constant, while the resistance Rj is variable in time with an oscillatory variation dependent on the movements of the level of fuel. At the output of the filter LPF there is thus the average value of this voltage Ib·Rj, which is therefore equivalent to the product of the biasing current Ib and the average value of the variable resistance Rj. The output voltage from the filter LPF maintains the value even during the phase in which the reference resistance Rth is biased and the input of the filter LPF assumes a zero voltage.

The invention uses the property that the filter LPF memorizes and maintains its output voltage to allow comparison with the reference resistance Rth. The comparator CMP receives at one input the voltage Ib·Rth and at the other input receives the average voltage Ib·Rj, and provides at its output a logic signal which indicates if the average variable resistance Rj is greater than or less than the reference resistance Rth. An instant before the end of the phase in which the reference resistance Rth is biased, the flip-flop FF, controlled by the clock signal CLCK, stores the logic output signal from the comparator CMP. This occurs since at this moment this logic signal is valid for controlling the lamp LAMP. The state of this is thus updated and then maintained by the flip-flop FF until the end of the subsequent biasing cycle of the reference resistance Rth.

Naturally, for greater security against erroneous indications, it is always possible to interpose between the output of the flip-flop FF and the lamp LAMP a circuit, which can be made using known techniques, which checks that the results of a certain number of successive measurement cycles are consistent before enabling any change of state of the lamp LAMP. As can be noted, the circuit according to the invention satisfies the requirements of controlling the lamp LAMP described initially. In fact, the switching threshold or change of state of the lamp LAMP depends, as is seen, on a comparison between the reference resistance Rth and the variable resistance Rj which is not connected in any way with the indicator instrument STR and its resistance values R1, R2. Damping of the signal generated by the sensor SENS is effected with the same filter LPF as is used for the indicator instrument STR, and, therefore, the correlation of the two dynamic behaviors is assured.

The programmability of the switching threshold is achieved with the choice of the value of the reference resistance Rth. Hysteresis is not implemented in the circuit of FIG. 3, but again those of skill in the art will readily appreciate conventional techniques for modifying the value of the reference resistance Rth as a function of the state of the lamp LAMP.

Figure 4:
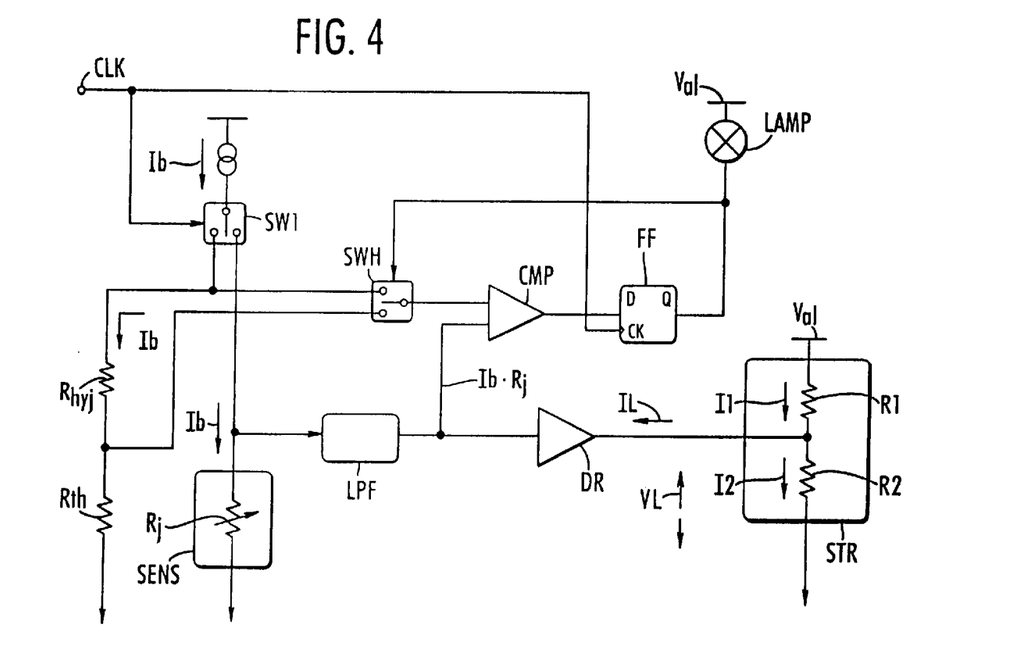
FIG. 4 is a schematic circuit representation of an alternative embodiment of the control circuit according to the invention.

FIG. 4 shows an exemplary embodiment of a circuit with hysteresis achieved by the insertion of a hysteresis resistance Rhys in series with the reference resistance Rth. This insertion is conditioned by the state of the lamp LAMP and is effected by means of a diverter switch SWH controlled by the output of the flip-flop FF, which itself determines the state of the lamp LAMP.

The control circuit according to the present invention has the following important advantages. First of all, there is an extremely limited reduction in performance of the processor circuit EL which controls the indicator instrument STR. This reduction is quantifiable as a loss of precision of 200 ppm in the example considered, but can be reduced at will by increasing the asymmetry between the biasing times of the sensor SENS and the reference resistance Rth. In other words, the reduction in performance can be reduced based upon the duty cycle of the clock signal CLK. On the other hand, the flow of output current is not in any way reduced or altered by additional series resistances.

In the prior art systems, moreover, all the elements of the processor circuit EL contribute to the generation of the average variable resistance Rj which controls the indicator instrument STR so that all these elements contribute to the generation of error in the switching threshold of the lamp LAMP. In a circuit according to the invention, on the other hand, only one of these elements, the filter LPF, makes a contribution to the error. In fact, the biasing current Ib is common to both the reference resistance Rth and to the variable resistance Rj such that its absolute value does not influence the measurement. The output circuit DR, moreover, is not in any way involved in controlling the lamp LAMP, and, therefore this, too, has no influence.

In the second prior art circuit of FIG. 2 the comparator CMP is called upon to compare voltages of very low value in that the voltage drop across the resistance Rs is typically as low as 100 mV at the switching threshold. This occurs because the resistance Rs is typically 10 Ohms at most, and should not significantly disturb the output resistance Rj which controls the indicator instrument STR when the current in this is at a maximum, for example, 100 mA. The same resistance Rs should also perform its switching function on the lamp LAMP when the current in the indicator instrument STR is low, for example, at 10 mA corresponding to a low fuel level.

It is clear, therefore, that an input offset of the comparator CMP, typically 1 mV, gives a consistent contribution to the imprecision, typically 1% of that of the control circuit. In the circuit according to the invention illustrated in FIG. 3, on the other hand, the input voltages at the comparator CMP are significantly higher, for example, 1 V. This is so because the variable resistance Rj is in the vicinity of, for example, 200 Ohms at its highest when the fuel level is close to the minimum and, therefore, close to the switching threshold of the lamp LAMP. The result of this is that the same comparator CMP used in the circuit according to the invention gives a significantly reduced contribution to the error with respect to the prior art, for example, 0.1%.

Figure 5:
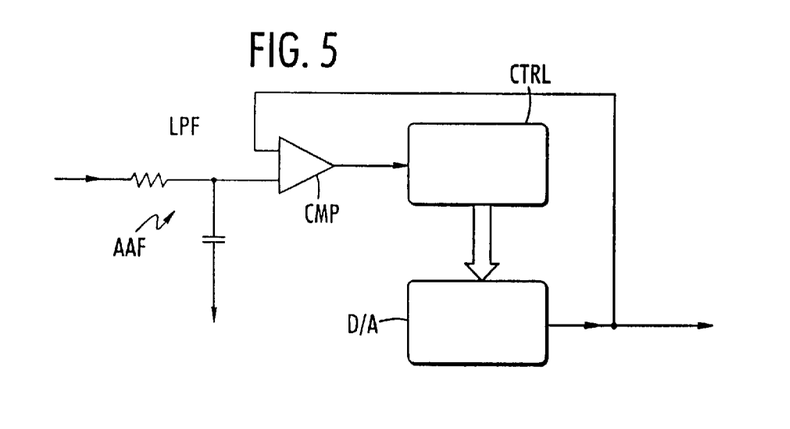
FIG. 5 is a schematic circuit representation of a portion of the detector system of FIG. 1, usable in association with the control circuit according to the present invention.

In a further embodiment illustrated in FIG. 5, a low pass filter LPF of a type known in the art is used in the control circuit according to the invention. As can be seen the filter of FIG. 5 is a feedback filter in which a part of the feedback loop is digital. The filter comprises, at its input, a so-called anti-aliasing filter AAF. This anti-aliasing filter AAF can be made, for example, by means of a low pass filter provided by a resistance and a capacitance. The output of the anti-aliasing filter AAF is connected to the input of a comparator CMP. The other input of the comparator CMP is connected to the output of the filter LPF itself. The output of the comparator CMP controls a circuit CTRL acting to generate digital signals. The digital output of the circuit CTRL is connected to a digital/analog convertor D/A. The output of the D/A convertor also provides the output of the filter LPF.

In this embodiment, a further improvement in the performance of the circuit is possible because the comparator CMP employed in the filter LPF (FIG. 5) can also fulfill the function of the comparator CMP used by the control circuit for the lamp LAMP. This is possible since the two comparators, if they were separate, would no longer be used contemporaneously. In fact, when the reference resistance Rth is biased it is necessary only that the comparator CMP compares the output of the filter LPF with the voltage present on the reference resistance Rth. When the variable resistance Rj is biased only the comparator CMP of the filter LPF, illustrated in FIG. 5, is used, and which compares the input and output of the filter LPF.

Figure 6:
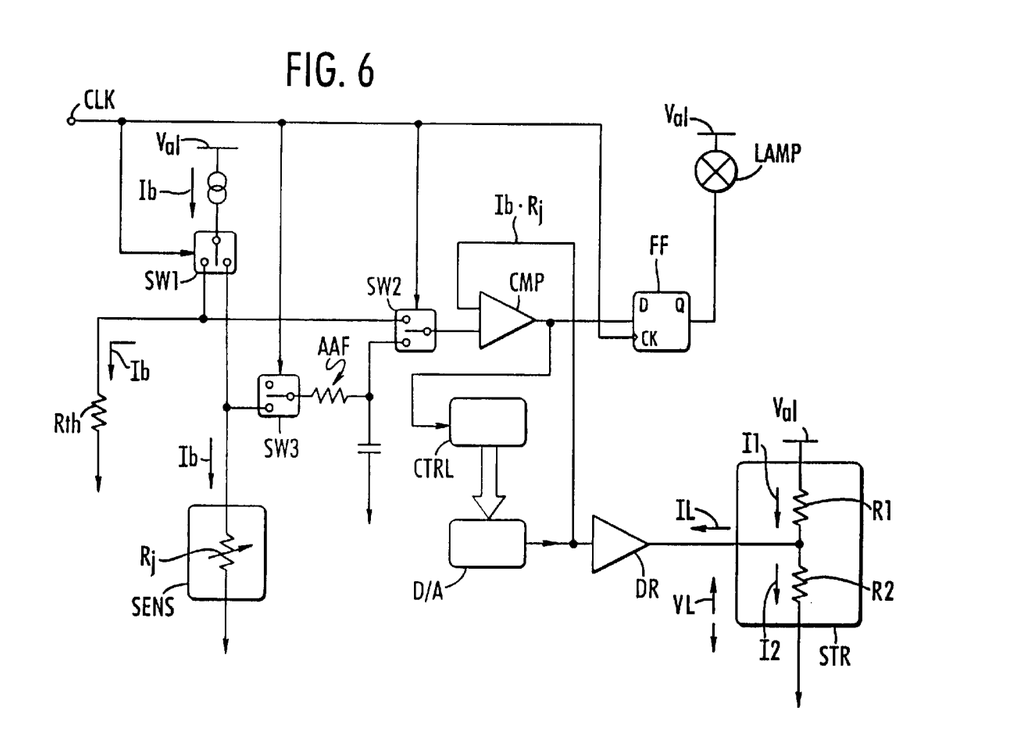
FIGS. 6 to 8 are schematic circuit representations of alternative embodiments of the control circuit according to the invention.

In FIG. 6 is illustrated a control circuit according to the invention equipped with the filter LPF of FIG. 5 in which the comparator CMP is used, in time division, to perform the function of controlling the lamp LAMP. The inverting input of the comparator CMP is maintained permanently connected to the output of the D/A convertor in that this configuration is common to its two functions. On the other hand, the non-inverting input is switched between the reference resistance Rth and the output of the anti-aliasing filter AAF of the filter LPF in synchronism with the clock signal CLK by means of a diverter switch SW2. This switch SW2 may have a relatively low cost because it acts on a signal of low current and voltage. It is observed that with this system the offset of the comparator CMP is canceled in comparison with the controlling of the lamp LAMP.

Moreover, the output voltage of the D/A convertor is displaced with respect to its theoretical value by a quantity equal to the offset of the comparator CMP. This is so because when this is used to evaluate the voltage of the reference resistance Rth, a comparison is performed with an identical error, in value and sign, to that contained in the voltage, namely the output of the D/A convertor is considered as a reference for the comparison itself.

The circuit illustrated in FIG. 6 has a further additional characteristic with respect to that of FIG. 3 given by the use of a switch SW3. The purpose of this is to disconnect the input of the anti-aliasing filter AAF from the sensor SENS at the moment in which this loses the biasing current Ib in favor of the reference resistance Rth. Consequently, in this time interval the incorrect voltage of the sensor SENS does not influence the anti-aliasing filter AAF which maintains its unaltered state, for example, by means of its capacitance. Therefore, the loss of precision caused by the duty cycle of the clock signal CLK, quantifiable as 200 ppm in the preceding example, thus converts into a single loss of information that the sensor SENS would provide in the time interval in which it is not biased. In other words, if during this time the variable resistance Rj of the sensor SENS were to remain substantially constant, there would be no loss of precision from this cause.

The resolution of the D/A convertor is the single source of imprecision for control of the lamp LAMP in the invention described up to this point apart from the previously-mentioned contribution of the duty cycle which is quantifiable at 200 ppm and which, however, can be statistically nullified. In fact, this D/A convertor, by memorizing the voltage on the sensor SENS to be compared with that on the reference resistance Rth, involves an error which can be up to half of its least significant bit. If, for example, there are ten bits the maximum error becomes:

$$0.5/1024=0.05\%=500 \text{ ppm}.$$

It can therefore be concluded that the precision of the commutation threshold of the lamp LAMP, achieved by means of the control circuit according to the invention, is equal to that of the reference resistance Rth in that all the other sources of error contribute in an entirely negligible manner considering the precision, typically 1%, of the best resistors which are normally used in the manufacture of electronic circuits of limited cost.

Figure 7:
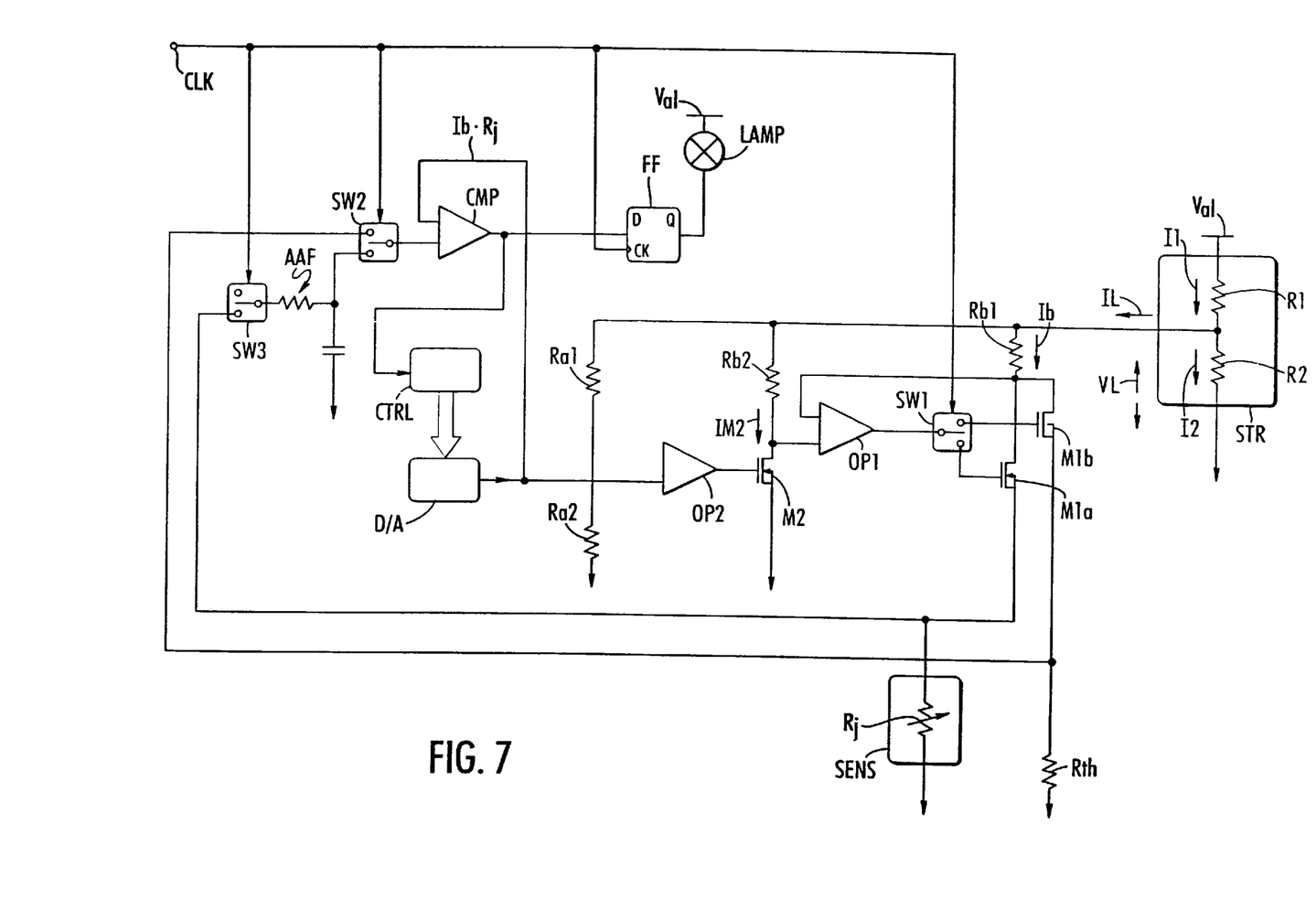

FIG. 7 shows a possible application of the present invention to the processor circuit EL which is the subject of an earlier invention. The switch SW1 for the biasing current Ib is provided with a pair of transistors Mla and Mlb. The signal switch SW1 then provides for the transmission of the output of an operational amplifier OPT to the transistor Mla or Mlb based upon the direction in which the biasing current Ib must flow. Note that all the components Ra1, Ra2, Rab2, OP1 which determine the precision of the biasing current Ib do not change their function whatever the state of the switch SW1, thereby ensuring that in both cases the biasing current Ib is exactly the same.

Figure 8:
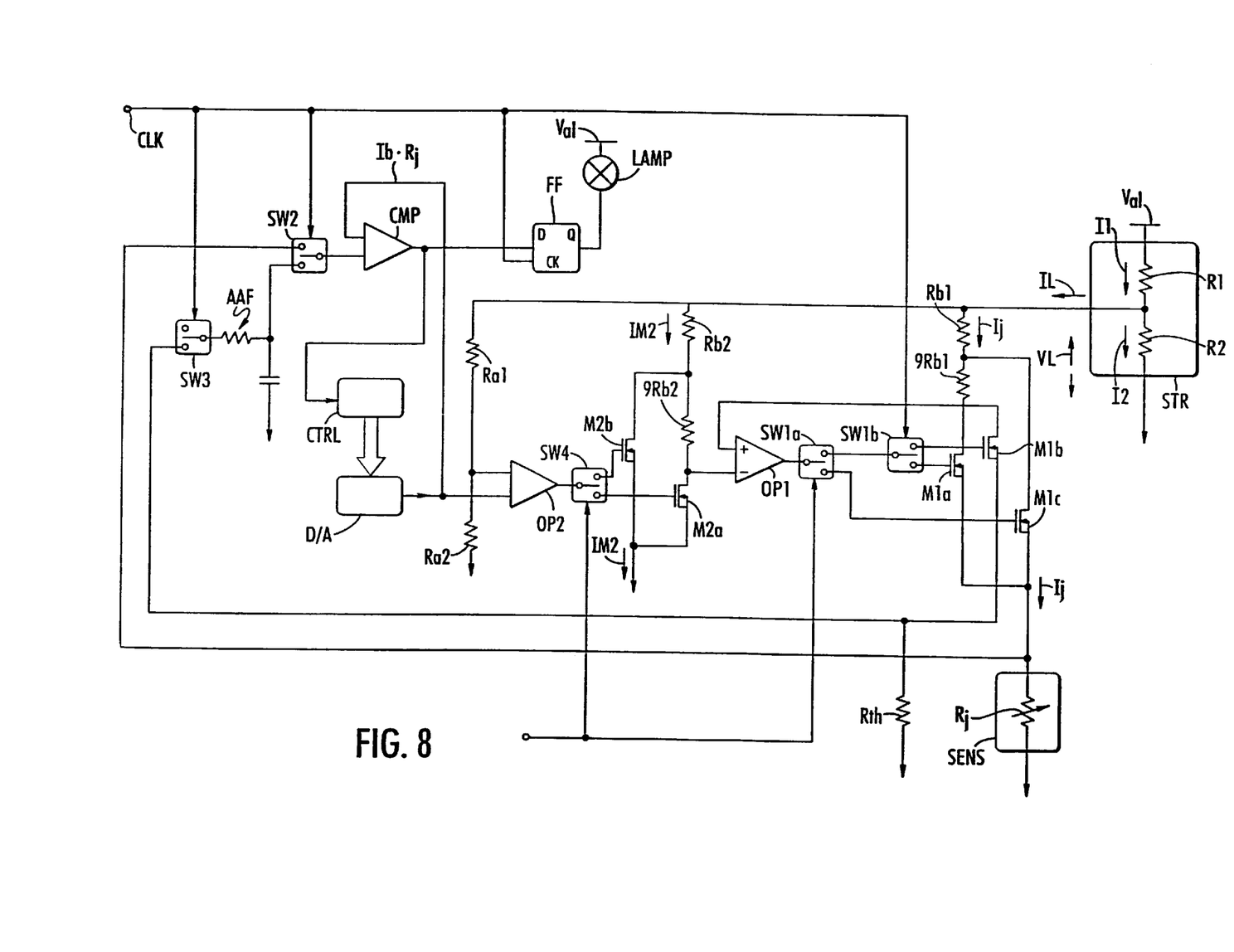

FIG. 8, in contrast, shows how the present invention can be applied to a processor circuit EL which also effects control of a ratiometric type. This circuit EL subdivides the output current range into several subintervals, each of which is managed by a pair of power transistors, as well as by a pair of current measuring resistors. Note that the control of the lamp LAMP does not require duplication of all the transistors which deliver the biasing current Ib to the sensor SENS in that if the biasing current Ib is high, then the fuel level indicated by the instrument STR is certainly high and therefore the lamp LAMP must remain extinguished. This is so without the necessity of performing the reference resistance sampling procedure on the resistance Rth. As seen by FIG. 8 the control circuit in this embodiment requires only the duplication of power transistors for controlling small currents Ib with evident economies in materials.

Naturally, the principle of the invention remaining the same, the details of construction and the embodiments can be widely varied with respect to what has been described and illustrated without by this departing from the ambit of the present invention.

What is claimed is:

1. A control circuit for an indicator device operable responsive to a signal relating to a physical parameter detected by a sensor, the signal also being sent to an indicator instrument operable to display information relating to the physical parameter, the control circuit comprising:
    a comparator; and
    a switch operable to periodically switch the signal towards the indicator device for a first time interval to display the information relating to the physical parameter, and towards said comparator for a second time interval;
    said comparator being operable to compare the signal with a predetermined threshold value to determine a state for the indicator device.

2. A circuit according to claim 1, wherein the first time interval is relatively long with respect to the second time interval.

3. A circuit according to claim 2, wherein the second time interval is less than or equal to about a thousandth of the first time interval.

4. A circuit according to claim 1, further comprising means for memorizing the signal during the second time interval.

5. A circuit according to claim 1, wherein said predetermined threshold value is programmable.

6. A circuit according to claim 1, further comprising hysteresis means for comparing the signal with a first threshold value to determine activation of the indicator device and with a second threshold value to determine deactivation of the indicator device to thereby activate commutation of the indicator device with hysteresis.

7. A circuit according to claim 6, wherein the first and second threshold values are programmable for programming the hysteresis.

8. A circuit according to claim 1, further comprising a low pass filter having digital feedback for control of the indicator instrument to compare the signal with the predetermined threshold value.

9. A circuit according to claim 1, further comprising means for determining commutation of the state of the indicator device only after a predetermined number of comparisons performed in a corresponding number of time periods based upon the first and second time intervals and having corresponding results.

10. A circuit according to claim 1, wherein the physical parameter is a level of a liquid in a tank, and wherein the indicator device is an illuminable indicator operable to indicate reaching a predetermined level of the liquid in the tank.

11. A circuit according to claim 1, wherein the sensor comprises means for generating a variable resistance as the signal.

12. A circuit according to claim 11, further comprising:
a reference resistance; and
means for injecting a biasing current into the variable resistance for the first time interval, and into the reference resistance for the second time interval.

13. A circuit comprising:
a sensor for generating a signal relating to a physical parameter;
an indicator device operable responsive to the signal relating to the physical parameter detected by said sensor;
an indicator instrument also operable to the signal relating to the physical parameter for displaying information relating thereto;
a comparator; and
a switch operable to periodically switch the signal towards said indicator device for a first time interval to display information relating to the physical parameter, and towards said comparator for a second time interval;
said comparator being operable to compare the signal with a predetermined threshold value to determine a state for the indicator device.

14. A circuit according to claim 13, wherein the first time interval is relatively long with respect to the second time interval.

15. A circuit according to claim 13, wherein the second time interval is less than or equal to about a thousandth of the first time interval.

16. A circuit according to claim 13, further comprising means for memorizing the signal during the second time interval.

17. A circuit according to claim 13, wherein said predetermined threshold value is programmable.

18. A circuit according to claim 13, further comprising hysteresis means for comparing the signal with a first threshold value to determine activation of the indicator device and with a second threshold value to determine deactivation of the indicator device to thereby activate commutation of the indicator device with hysteresis.

19. A circuit according to claim 18, wherein the first and second threshold values are programmable for programming the hysteresis.

20. A circuit according to claim 13, further comprising a low pass filter having digital feedback for control of the indicator instrument to compare the signal with the predetermined threshold value.

21. A circuit according to claim 13, further comprising means for determining commutation of the state of the indicator device only after a predetermined number of comparisons performed in a corresponding number of time periods based upon the first and second time intervals and having corresponding results.

22. A circuit according to claim 13, wherein the physical parameter is a level of a liquid in a tank, and wherein the indicator device is an illuminable indicator operable to indicate reaching a predetermined level of the liquid in the tank.

23. A circuit according to claim 13, wherein the sensor comprises means for generating a variable resistance as the signal.

24. A circuit according to claim 23, further comprising:
a reference resistance; and
means for injecting a biasing current into the variable resistance for the first time interval, and into the reference resistance for the second time interval.

25. A method for controlling an indicator device operable responsive to a signal relating to a physical parameter detected by a sensor, the signal also being sent to an indicator instrument operable to display information relating to the physical parameter, the method comprising the steps of:
providing a comparator; and
periodically switching the signal towards the indicator device for a first time interval to display the information relating to the physical parameter, and towards said comparator for a second time interval; and
operating said comparator to compare the signal with a predetermined threshold value to determine a state for the indicator device.

26. A method according to claim 25, wherein the first time interval is relatively long with respect to the second time interval.

27. A method according to claim 25, wherein the second time interval is less than or equal to about a thousandth of the first time interval.

28. A method according to claim 25, further comprising the step of memorizing the signal during the second time interval.

29. A method according to claim 25, further comprising the step of programming the predetermined threshold value.

30. A method according to claim 25, further comprising the step of comparing the signal with a first threshold value to determine activation of the indicator device and with a second threshold value to determine deactivation of the indicator device to thereby activate commutation of the indicator device with hysteresis.

31. A method according to claim 30, further comprising the step of programming the first and second threshold values.

32. A method according to claim 25, further comprising the step of determining commutation of the state of the indicator device only after a predetermined number of comparisons performed in a corresponding number of time periods based upon the first and second time intervals and having corresponding results.

33. A method according to claim 25, wherein the physical parameter is a level of a liquid in a tank, and wherein the indicator device is an illuminable indicator operable to indicate reaching a predetermined level of the liquid in the tank.

34. A method according to claim 25, wherein the sensor comprises means for generating a variable resistance as the signal; and further comprising the steps of providing a reference resistance, and injecting a biasing current into the variable resistance for the first time interval, and into the reference resistance for the second time interval.

* * * * *